(12) United States Patent
Yasui et al.

(10) Patent No.: US 9,381,595 B2
(45) Date of Patent: Jul. 5, 2016

(54) PB-FREE SOLDER AND ELECTRONIC COMPONENT BUILT-IN MODULE

(71) Applicant: TDK CORPORATION, Tokyo (JP)

(72) Inventors: Tsutomu Yasui, Tokyo (JP); Kenichi Kawabata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/923,853

(22) Filed: Oct. 27, 2015

(65) Prior Publication Data

US 2016/0121434 A1    May 5, 2016

(30) Foreign Application Priority Data

Oct. 29, 2014  (JP) ................. 2014-220090

(51) Int. Cl.
| | |
|---|---|
| *H05K 1/09* | (2006.01) |
| *B23K 35/26* | (2006.01) |
| *H05K 1/11* | (2006.01) |
| *H05K 1/18* | (2006.01) |
| *C22C 13/02* | (2006.01) |
| *C22C 19/03* | (2006.01) |
| *B23K 35/02* | (2006.01) |

(52) U.S. Cl.
CPC ........... *B23K 35/262* (2013.01); *B23K 35/0244* (2013.01); *C22C 13/02* (2013.01); *C22C 19/03* (2013.01); *H05K 1/11* (2013.01); *H05K 1/181* (2013.01)

(58) Field of Classification Search
CPC ......... H01L 21/02; H01L 21/34; H01L 21/50; H01L 21/56; H01L 21/60; B23K 35/00; B23K 35/24; B23K 35/25; B23K 35/26; B23K 35/34; H05K 3/34
USPC ................ 174/257, 94 R; 438/123, 613, 771; 148/24; 228/101, 246, 56.3, 180.21; 257/E23.023, 772, 798
See application file for complete search history.

(56) References Cited

U.S. PATENT DOCUMENTS

| | | | |
|---|---|---|---|
| 6,689,488 B2 * | 2/2004 | Yoshitome | B23K 35/262 420/557 |
| 2002/0009610 A1 * | 1/2002 | Shimokawa | B23K 35/004 428/647 |
| 2002/0019077 A1 * | 2/2002 | Shimokawa | B23K 1/0016 438/123 |
| 2002/0114726 A1 * | 8/2002 | Soga | H05K 3/3484 420/557 |
| 2002/0163085 A1 * | 11/2002 | Shimokawa | B23K 1/0016 257/772 |
| 2002/0171157 A1 * | 11/2002 | Soga | H05K 3/3484 257/783 |
| 2004/0062679 A1 * | 4/2004 | Munekata | B23K 1/0016 420/560 |

(Continued)

FOREIGN PATENT DOCUMENTS

JP       2001-062561 A     3/2001

*Primary Examiner* — Xiaoliang Chen
(74) *Attorney, Agent, or Firm* — Oliff PLC

(57) ABSTRACT

A Pb-free solder includes a first metal including at least Sn and Bi, and a second metal including at least an Ni—Fe alloy. In the first metal, the sum of Sn and Bi is 90 mass % or more, and a ratio of Bi is 5 to 15 mass %. A ratio of the second metal to the sum of mass of the first metal and mass of the second metal is 5 to 30 mass %.

4 Claims, 7 Drawing Sheets

(56) References Cited

U.S. PATENT DOCUMENTS

| | | | | |
|---|---|---|---|---|
| 2005/0029666 A1* | 2/2005 | Kurihara | ............... | H01L 21/561 257/772 |
| 2005/0106060 A1* | 5/2005 | Kato | ........................ | B22F 9/08 420/560 |
| 2006/0115994 A1* | 6/2006 | Shimokawa | ......... | B23K 1/0016 438/771 |
| 2006/0145352 A1* | 7/2006 | Soga | .................... | H05K 3/3484 257/772 |
| 2008/0061117 A1* | 3/2008 | Munekata | ............ | B23K 1/0016 228/259 |
| 2008/0292492 A1* | 11/2008 | Ingham | ................ | B23K 35/262 420/561 |
| 2009/0195188 A1* | 8/2009 | Maniwa | .................... | H01J 5/52 315/294 |
| 2010/0062597 A1* | 3/2010 | Belanger | ................. | H01L 24/03 438/613 |
| 2010/0294565 A1* | 11/2010 | Kawamata | ........... | B23K 1/0016 148/94 R |
| 2012/0018048 A1* | 1/2012 | Yamashita | ............ | B23K 1/0016 148/24 |
| 2013/0286621 A1* | 10/2013 | Shimokawa | ......... | B23K 1/0016 361/783 |
| 2013/0327444 A1* | 12/2013 | Sawamura | ........... | B23K 35/025 148/24 |
| 2014/0061287 A1* | 3/2014 | Ohnishi | ................. | B23K 35/26 228/246 |

* cited by examiner

PB-FREE SOLDER AND ELECTRONIC COMPONENT BUILT-IN MODULE

TECHNICAL FIELD

The present invention relates to a Pb-free solder and an electronic component built-in module including the Pb-free solder.

BACKGROUND

An electronic component built-in module manufactured by mounting an electronic component, such as a passive element, on a substrate is mounted on a substrate of an electronic device so as to be used. As solder used for bonding the electronic component in the electronic component built-in module and mounting the electronic component built-in module, a Pb-free solder including no Pb (lead) has been known.

When the electronic component built-in module is mounted on the substrate of the electronic device, reflow for melting the solder is performed. Various examinations have been conducted in order to prevent the solder for bonding the electronic component and the substrate in the electronic component built-in module from scattering or moving upon the reflow. For example, JP 2001-62561 A discloses a configuration in which after different kinds of metal layers to be alloyed and to be a brazing filler metal are laminated on at least one of two members to be brazed, the two members are brazed.

SUMMARY

However, the configuration described in JP 2001-62561 requires to laminate and form the different kinds of metal layers to be alloyed and to be the brazing filler metal on at least one of the two members to be brazed by, for example, plating. Therefore, operation requires much labor. In particular, when a terminal electrode of a substrate and a terminal electrode of an electronic component of which miniaturization has been progressing are bonded, operation requires much labor.

The present invention has been made in consideration of the above problem. An object of the present invention is to provide a Pb-free solder capable of inhibiting degradation of workability and preventing melting upon reheating, and an electronic component built-in module including the Pb-free solder.

In order to achieve the above object, the Pb-free solder according to the present invention includes a first metal including at least Sn and Bi, and a second metal including at least an Ni—Fe alloy. In the first metal, the sum of Sn and Bi is 90 mass % or more, and a ratio of Bi is 5 to 15 mass %. A ratio of the second metal to the sum of mass of the first metal and mass of the second metal is 5 to 30 mass %.

As described above, the Pb-free solder is constituted by adding the second metal including at least an Ni—Fe alloy to the first metal including at least Sn and Bi. In the Pb-free solder in a first melting process, an reaction between Sn in the first metal and the Ni—Fe alloy in the second metal progresses. Then, an Ni—Sn phase is formed in tissue of the Pb-free solder that has hardened after the melting. Accordingly, the Pb-free solder that has hardened after the Pb-free solder melts once, has a melting point higher than that before the first melting. Thus, heat resistance is improved and the melting upon the reheating can be prevented. The above Pb-free solder can bond two members in the same process as typical solder. Therefore, the degradation of workability is inhibited upon the bonding of the two members, Here, the first metal and the second metal can be granular. When the first metal and the second metal are granular, a contact area between the first metal and the second metal increases and an reaction between Sn and Ni—Fe accelerates. Therefore, the melting point of the Pb-free solder that has hardened after the melting can securely increase.

An average particle diameter of the second metal can be 3 to 50 μm. Arranging that the average particle diameter of the second metal is 3 to 50 μm facilitates manufacturing and handling of a particle of the second metal. In addition, the heat resistance of the Pb-free solder that has hardened after melting once can be securely improved.

The electronic component built-in module according to the present invention includes an electronic component and a substrate on which the electronic component is mounted. A terminal of the electronic component and a terminal of the substrate are bonded with the Pb-free solder.

Since the terminal of the electronic component and the terminal of the substrate are bonded with the Pb-free solder in the electronic component built-in module, a risk that, for example, a bonding defect of the terminal of the electronic component occurs, can be reduced.

According to the present invention, there are provided the Pb-free solder capable of inhibiting the degradation of workability and preventing the melting upon the reheating, and the electronic component built-in module including the Pb-free solder.

DETAILED DESCRIPTION

An embodiment of the present invention will be described in detail below with reference to the attached drawings. Note that, in descriptions of the drawings, substantially the same elements are denoted with the same reference signs, and the duplicate descriptions thereof will be omitted.

Figure 1:
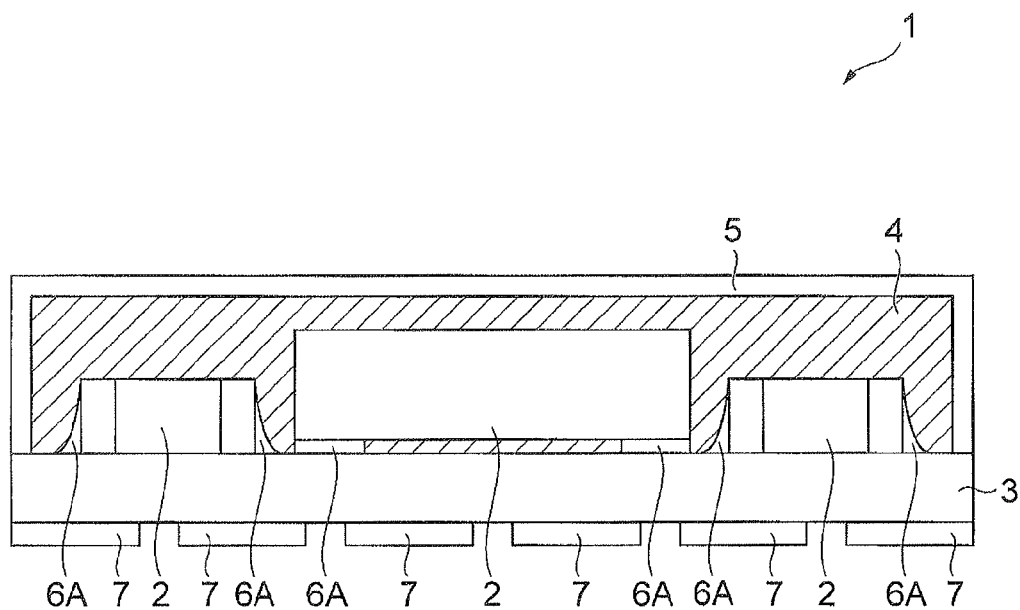
FIG. 1 is a cross-sectional view of an electronic component built-in module.
Figure 2:
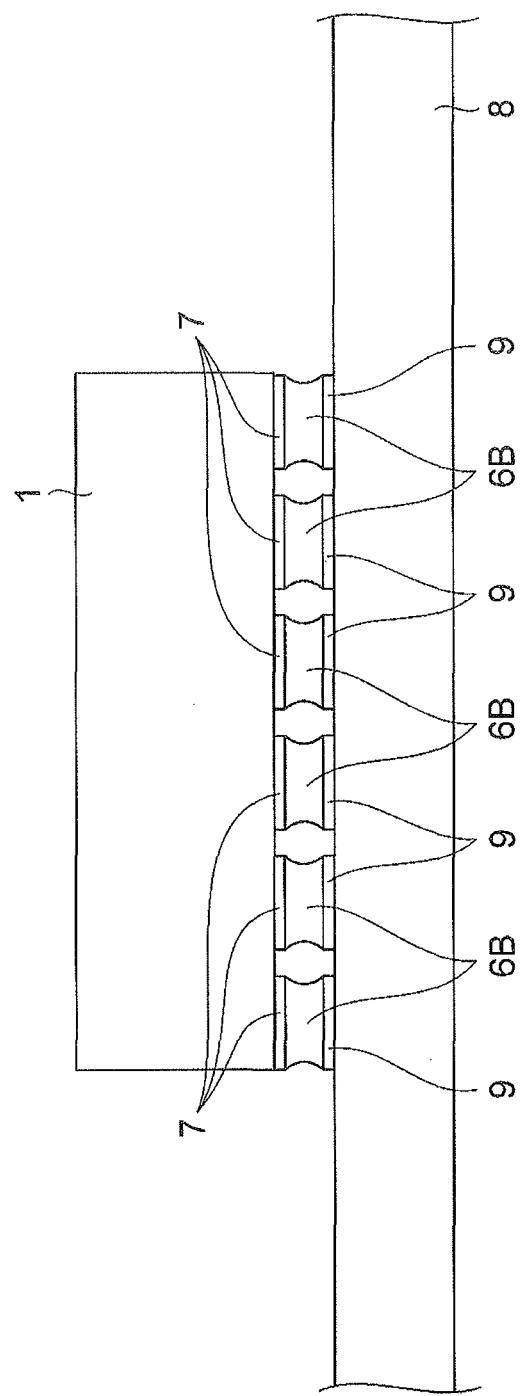
FIG. 2 is a side view of the electronic component built-in module mounted on a substrate of, for example, an electronic device.

FIG. 1 is a cross-sectional view of an electronic component built-in module. FIG. 2 is a side view of the electronic component built-in module mounted on a substrate of, for example, an electronic device. As illustrated in FIG. 1, an electronic component built in module 1 is a module that includes a plurality of electronic components 2 mounted on a substrate 3 and has a set of functions. The electronic component 2 may be mounted on a surface of the substrate 3 or inside the substrate 3. According to the present embodiment, as the electronic component 2 included in the electronic component built-in module 1, a passive element, such as a coil, a capacitor, or a resistance are used. As the electronic component 2, an active element, such as a diode or a transistor, or an integral circuit (IC) may be also mounted on the surface of the substrate 3 or inside the substrates 3. The electronic component 2 is not limited to these components.

As illustrated in FIG. 1, the electronic component built-in module 1 includes the substrate 3 as a circuit board on which the electronic component 2 is mounted, an insulating resin 4 for covering the electronic component 2, and a shielding layer 5 for covering a surface of the insulating resin 4. Note that the electronic component built-in module 1 may not include the shielding layer 5. A terminal electrode of the electronic component 2 and a terminal electrode of the substrate 3 are bonded with a Pb-free solder 6A (hereinafter, referred to as first solder) according to the present embodiment. Accordingly, the electronic component 2 is mounted on the substrate 3. As described above, the first solder 6A serves to bond the terminal electrode of the electronic component 2 and the terminal electrode of the substrate 3.

As illustrated in FIG. 1, in the electronic component built-in module 1, the insulating resin 4 covers the electronic component 2 mounted on the substrate 3. In the electronic component built-in module 1, the insulating resin 4 also covers the surface of the substrate 3 on the side on which the electronic component 2 is mounted (also referred to as a component mounting surface). As described above, in the electronic component built-in module 1, the insulating resin 4 covers the plurality of electronic components 2 and the component mounting surface so that the substrate 3 and the plurality of electronic components 2 are integrally formed and strength is also secured.

The shielding layer 5 is formed on the surface of the insulating resin 4 that covers the plurality of electronic components 2. For example, an epoxy resin as a thermosetting resin can be used as the insulating resin 4. However, the insulating resin 4 is not limited to this resin. Note that the insulating resin 4 may include an additive, such as a filler.

According to the present embodiment, the shield layer 5 is constituted of a conductive material (a material having conductivity, and a metal is used according to the present embodiment). According to the present embodiment, the shield layer 5 may be constituted of a single conductive material or a plurality of layers of conductive materials. The shield layer 5 covers the surface of the insulating resin 4 so as to shield the electronic component 2 enclosed inside the insulating resin 4 from, for example, a high frequency noise or an electromagnetic wave from the outside of the electronic component built-in module 1, or shield, for example, a high frequency noise emitted from the electronic component 2. As described above, the shield layer 5 serves as an electromagnetic shield. According to the present embodiment, the shield layer 5 covers the entire surface of the insulating resin 4. Note that the shield layer 5 may cover the insulating resin 4 so as to satisfy a function required as the electromagnetic shield. The shield layer 5 does not necessarily need to cover the entire surface of the insulating resin 4. Therefore, the shield layer 5 may cover at least a part of the surface of the insulating resin 4.

Note that the electronic component built-in module 1 may not include the shield layer 5. In this case, the insulating resin 4 also covers a region corresponding to the shield layer 5 of the electronic component built-in module 1.

The electronic component built-in module 1 is manufactured by the following procedure.

(1) Print a solder paste including the first solder 6A on the terminal electrode of the substrate 3.

(2) Use a mounter so that the electronic component 2 is disposed on the substrate 3.

(3) Put the substrate 3 including the electronic component 2 disposed thereon into a reflow furnace and heat the solder paste. Melt and harden the first solder 6A included in the solder paste so that the terminal electrode of the electronic component 2 and the terminal electrode of the substrate 3 are bonded (a reflow process).

(4) Clean flux adhering to the electronic component 2 and the surface of the substrate 3.

(5) Cover the electronic component 2 and the substrate 3 with the insulating resin 4 (a mold process).

In the reflow process in the above procedure, the maximal temperature of the reflow furnace is typically set so as to be approximately 240 to 260° C. Then, the melting and the hardening of the first solder 6A included in the solder paste are performed. The mold process is appropriately changed depending on, for example, a material of the insulating resin 4. For example, hardening of the insulating resin 4 is performed by heating at 175° C. for four hours.

The substrate 3 includes a terminal electrode (a module terminal electrode) 7 on the opposite side of the component mounting surface. The module terminal electrode 7 is electrically coupled to the electronic component 2 included in the electronic component built-in module 1. As illustrated in FIG. 2, the module terminal electrode 7 is also bonded to a terminal electrode (a device board terminal electrode) 9 of a substrate 8 on which the electronic component built-in module 1 is mounted (for example, a substrate of an electronic device, hereinafter, referred to as a device board) with solder (hereinafter, referred to as second solder) 6B. Accordingly, the electronic component built-in module 1 exchanges an electrical signal and power between the electronic component 2 and the device board 8.

The device board 8 illustrated in FIG. 2 is a substrate on which the electronic component built-in module 1 is mounted. For example, the device board 8 is disposed in an electronic device (for example, an in-vehicle electronic device or a mobile electronic device). When the electronic component built-in module 1 is mounted on the device board 8, for example, a solder paste including the second solder 6B is printed on the device board terminal electrode 9 and then a mounter is used so that the electronic component built-in module 1 is disposed on the device board 8. The device board 8 including the electronic component built-in module 1 disposed thereon is put into the reflow furnace and is heated so that the second solder 6B included in the solder paste melts and hardens. As a result, the module terminal electrode 7 and the device board terminal electrode 9 are bonded. After that, flux adhering to the electronic component built-in module 1 and a surface of the device board 8 is cleaned.

A melting temperature of a Pb-free solder used for manufacturing an electronic component built-in module is typically approximately 220° C. In contrast, the maximal temperature upon the reflow is approximately 240 to 260° C. As described above, since the reflow is performed when the electronic component built-in module 1 is mounted on the device board 8, solder that does not melt at the temperature upon the reflow (high temperature solder) is used for the first solder 6A used for mounting the electronic component 2 included in the electronic component built-in module 1, on the substrate 3.

Solder including Pb includes solder with a melting temperature of approximately 300° C. However, no Pb-free solder has a melting temperature of 260° C. or more, and an appropriate property. Accordingly, when the Pb-free solder is used, two types of solder that have a small difference between melting temperatures of the two types of solder may be used for the solder used for bonding the electronic component 2 included in the electronic component built-in module 1 (first solder 6A) and the solder used for mounting the electronic component built-in module 1 on the device board 8 (second solder 6B).

When the solder used for bonding the electronic component 2 included in the electronic component built-in module 1 remelts upon the reflow, a defect, such as a movement of the first solder 6A or solder flash (scatter of solder) occurs. As a result, a short-circuit or contact failure of the electronic component 2 may occur. Accordingly, solder that does not remelt upon the reflow when the electronic component built-in module 1 is mounted, or solder with the remelting that does not cause the movement of the first solder 6A or the solder flash, is preferably used for the solder for bonding the electronic component 2 of the electronic component built-in module 1. An alternative of solder with a high melting temperature includes a conductive adhesive (for example, an Ag paste). However, the conductive adhesive has problems, such as low mechanical strength, high electric resistance, and a high cost. Therefore, the conductive adhesive is not used as the alternative of the solder. The first solder 6A used for bonding the electronic component 2 included in the electronic component built-in module 1 according to the present embodiment is a Pb-free solder that satisfies the above requirements.

Figure 3:
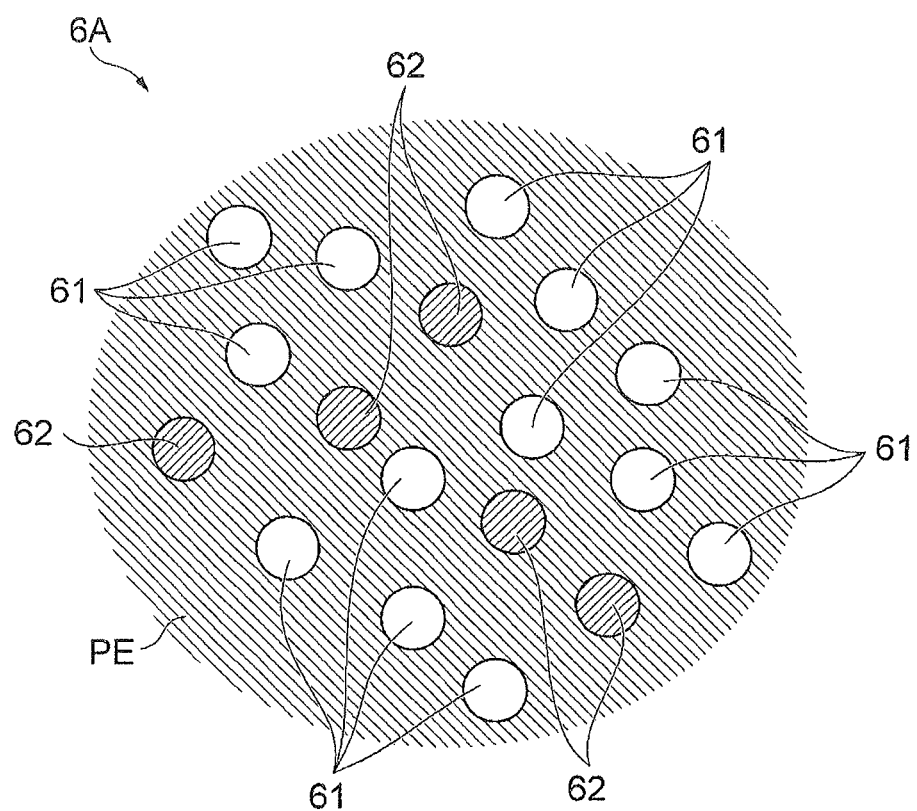
FIG. 3 is a conceptual diagram of a Pb-free solder according to the present embodiment.
Figure 4:
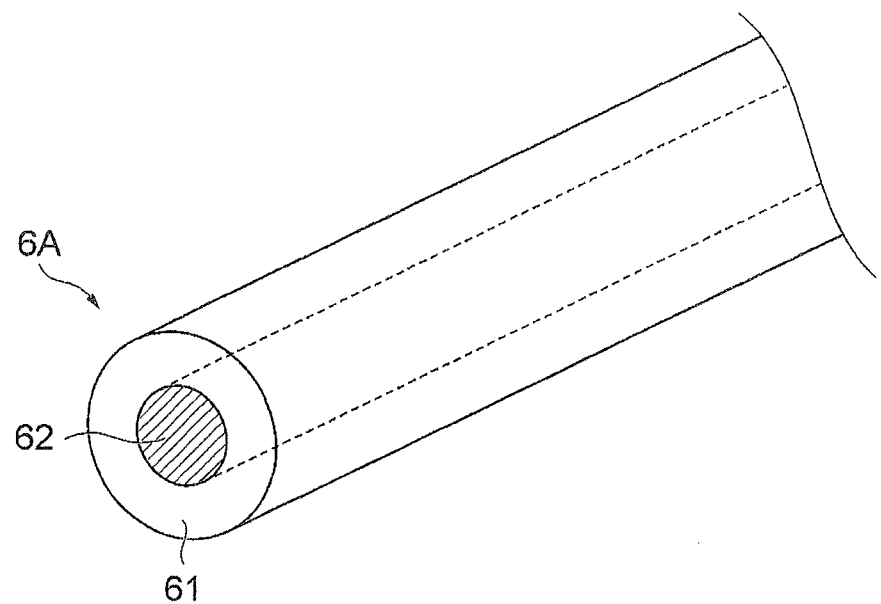
FIG. 4 is a conceptual diagram of the Pb-free solder according to the present embodiment.

FIGS. 3 and 4 are conceptual diagrams of the Pb-free solder according to the present embodiment. The Pb-free solder according to the present embodiment, namely, the first solder 6A includes a first metal 61 including at least tin (Sn) and bismuth (Bi), and a second metal 62 including as least a nickel (Ni)-iron (Fe) alloy before use (before melting). The first solder 6A illustrated in FIG. 3 is a solder paste made by dispersing the granular first metal 61 and the granular second metal 62 into a paste material PE. The first solder 6A illustrated in FIG. 4 is wiry solder including the second metal 62 as a core covered with the first metal 61. As described above, before the melting, the first solder 6A may be in a state where the first metal 61 including at least Sn and Bi, and the second metal 62 including at least the Ni—Fe alloy are mixable upon the melting.

The first metal 61 includes at least Sn and Bi. However, since the first solder 6A is a Pb-free solder, the first solder 6A includes no Pb. The first metal 61 may include at least one of silver (Ag) and copper (Cu). The second metal 62 includes at least the Ni—Fe alloy. That is, the second metal 62 may include at least one of cobalt (Co), molybdenum (Mo), copper (Cu), and chrome (Cr) other than the Ni—Fe alloy.

According to the present embodiment, the so-called SnBi solder (a Pb-free solder) is used as the first metal 61. In the first metal 61, the sum of Sn and Bi is 90 mass % or more, and Bi is 5 to 15 mass %, Since this type of solder includes an Sn phase accounting for most of tissue after the reflow, when the reflow is performed several times, the Sn phase remelts. Accordingly, according to the present embodiment, as a metal that compounds with Sn so as to easily produce a compound upon the reflow, the second metal 62 including at least the Ni—Fe alloy is added to the first metal 61. That is, the Ni—Fe alloy is added to the first metal 61 including Sn and Bi. Accordingly, when the first solder 6A first melts, Sn included in the first metal 61 and Ni—Fe included in the second metal 62 react with each other so that the tissue having high thermal resistance is produced when the first solder 6A hardens. For example, even when the first solder 6A is heated by the second reflow, remelting of the first solder 6A is inhibited.

Figure 5:
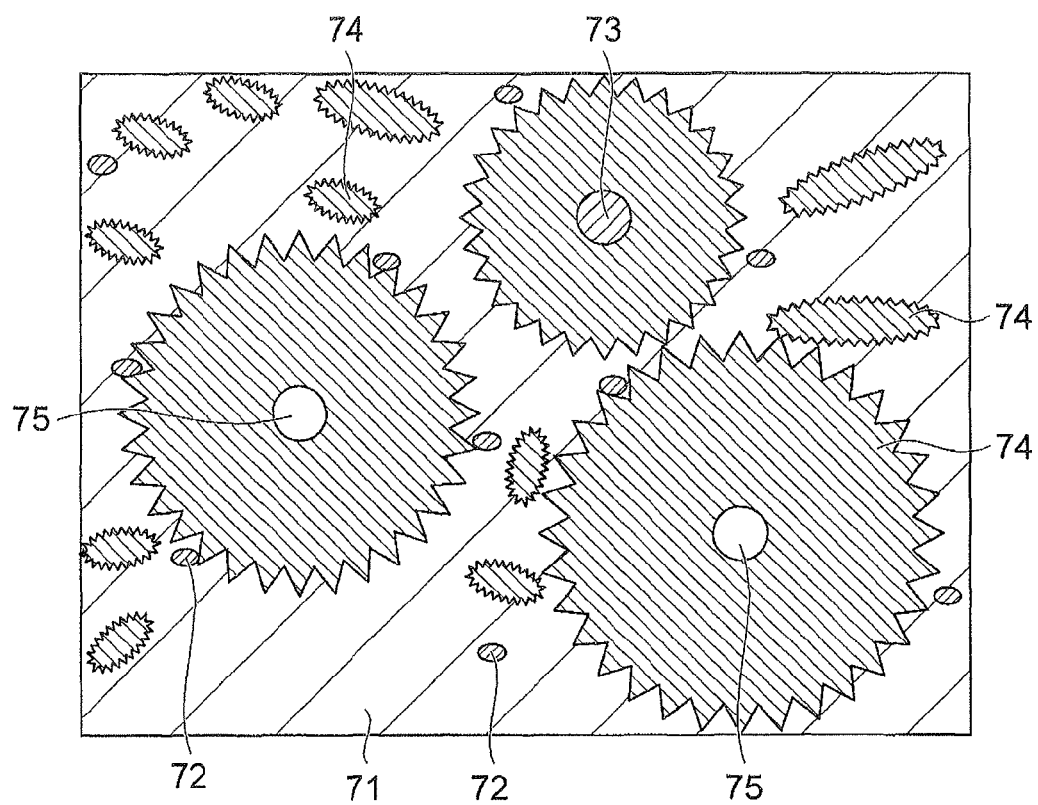
FIG. 5 is a schematic view of tissue of first solder after hardening.
Figure 6:
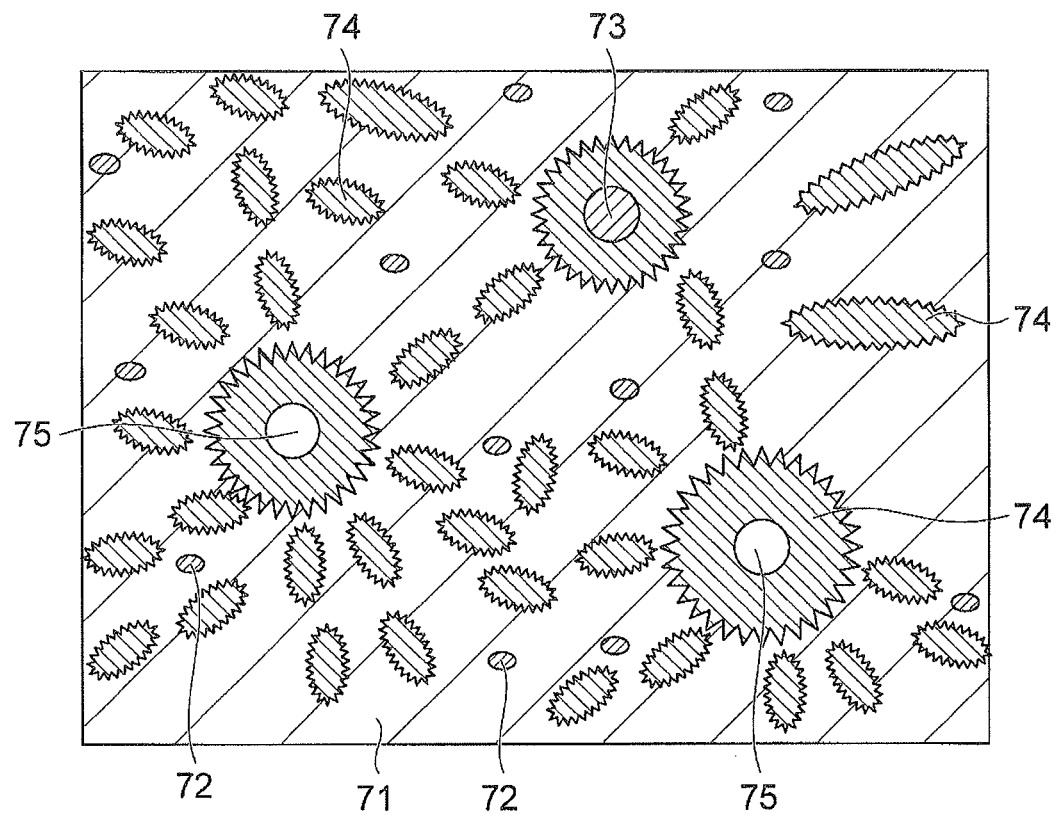
FIG. 6 is a schematic view of the tissue of the first solder after hardening.

FIGS. 5 and 6 are schematic views of tissue of first solder 6A after hardening; In FIG. 5, an additive amount of Bi is 7.5 mass % in the first metal 61 before the hardening. In FIG. 6, the additive amount of Bi is 12.5 mass % in the first metal 61 before the hardening. As illustrated in FIGS. 5 and 6, in the first solder 6A after the hardening, a Bi phase 72 disperses and precipitates in the Sn phase 71 deriving from the first metal 61 An Ni—Sn phase 74 caused by a reaction between Sn deriving from the first metal 61 and Ni deriving from the second metal 62 is formed around an Ni—Fe phase 73 deriving from the second metal 62. In a region where the reaction between Ni and Sn has progressed, a part where the Ni—Fe phase 73 is on the inside of the Ni—Sn phase 74 may become a hole 75. When the additive amount of Bi increases, as illustrated in FIG. 6, the Ni—Sn phase 74 formed around the Ni—Fe phase 73 becomes smaller and an Ni—Sn phase 74 disperses inside the Sn phase 71. When the additive amount of Bi is small (in FIG. 5), the Bi phase 72 is formed around the Ni—Sn phase 74. In contrast, when the additive amount of Bi increases (in FIG. 6), the Bi phase 72 disperses inside the Sn phase 71.

Accordingly, in the first solder 6A after the hardening, the Ni—Sn phase 74 disperses and remains in the Sn phase 71 deriving from the first metal 61. The Ni—Sn phase 74 obtained by the reaction between Ni and Sn has a melting point of more than 400° C. Therefore, the Ni—Sn 74 is prevented from remelting, for example, upon the reflow for the second solder 6B. For example, the Sn phase 71 having a low melting point is also around the Ni—Sn phase 74. However, since the Ni—Sn phase 74 is formed, for example, the scatter or the movement of the solder due to the melting of the Sn phase 71 is inhibited.

The Ni—Sn phase 74 harder than the Sn phase 71 disperses inside the Sn phase 71. Therefore, occurrence of a solder crack in the first solder 6A can be prevented. Even when the first solder 6A after the hardening receives some kind of shock and a fissure occurs on a part of the first solder 6A, since the Ni—Sn phase 74 disperses inside the Sn phase 71, the fissure can be prevented from becoming large when comparing with a case where the same phase spreads. An effect according to the prevention of the occurrence of the solder crack improves, in particular, as illustrated in FIG. 6, when deviation of dimensions of the Ni—Sn phase 74 becomes small and the Ni—Sn phase 74 disperses inside the Sn phase 71. In the first solder 6A after the hardening, also dispersing the Bi phase 72 harder than the Sn phase 71 in the Sn phase 71 increases different phases dispersing inside the Sn phase 71. Therefore, the effect according to the prevention of the occurrence of the solder crack improves.

Figure 7:
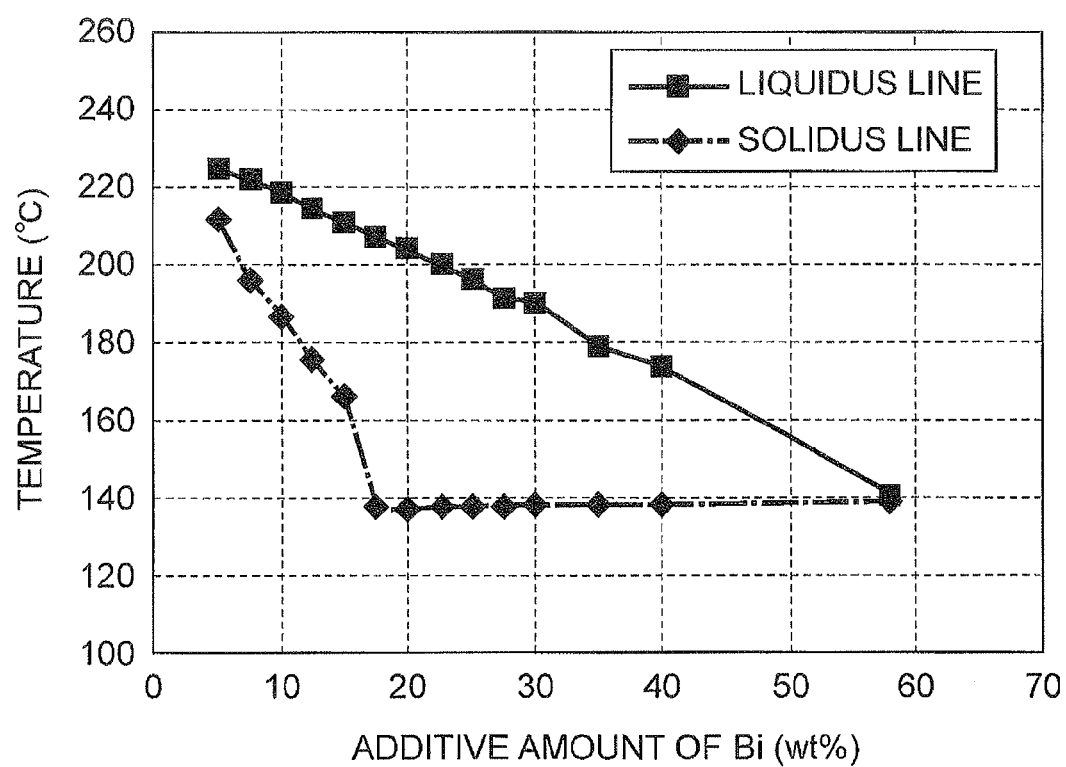
FIG. 7 is a graphical representation of variations of a solidus temperature and a liquidus temperature when an additive amount of Bi is changed with respect to the sum of Sn and Bi.

A liquidus temperature and a solidus temperature of solder including Bi like the first metal 61 vary depending on the additive amount of Bi. FIG. 7 is a graphical representation illustrating a solidus line representing a variation of the solidus temperature and a liquidus line representing a variation of the liquidus temperature when the additive amount of Bi varies with respect to the sum of Sn and Bi. As illustrated in FIG. 7, when the additive amount of Bi is 5 mass % or more, the solidus temperature decreases. Thus, the reaction between Ni and Sn can accelerate at a lower temperature. Therefore, for example, in the mold process where the insulating resin 4 covers the electronic component 2 and the substrate 3 after the first solder 6A hardens, the reaction between Ni and Sn can also accelerate. As a result, there is no need to arrange an additional heating process for accelerating the reaction between Ni and Sn.

Note that, as illustrated in FIG. 7, when the additive amount of Bi exceeds 15 mass %, the solidus temperature decreases to an eutectic temperature (approximately 139° C.). Thus, it can be thought that the first solder after the hardening may remelt in a post-stage process. When the additive amount of Bi exceeds 15 mass %, a segregation amount of Bi may increase in the first solder 6A after the hardening. Hardness of Bi is higher than that of a solder phase mostly including Sn. When the segregation amount of Bi increases in the first solder 6A after the hardening, the crack may easily progress due to a hard and brittle property of Bi itself.

According to the present embodiment, the second metal 62 including the Ni—Fe alloy that easily reacts with Sn is further added to the first metal 61 including Sn and Bi. Accordingly, an reaction between Sn and the Ni—Fe alloy can promptly progress for a short period of time required for the reflow.

In order to increase a melting point of the first solder 6A that has hardened after the melting, it is necessary to accelerate the reaction between Sn and Ni—Fe in a melting state and then accelerate a formation of the Ni—Sn phase 74. Accordingly, as illustrated in FIG. 3, the first metal 61 and the second metal 62 that constitute the first solder 6A before the melting are preferably granular. As described above, since a contact area between the first metal 61 and the second metal 62 increases, the reaction between Sn and Ni—Fe accelerates. Accordingly, the first solder 6A that has hardened after the melting can be prevented from remelting. Note that, as illustrated in FIG. 4, when the first solder 6A before the melting is wiry, at least the second metal 62 is preferably granular. Note that, when the first metal 61 and/or the second metal 62 are granular, particles of the first metal 61 and/or the second metal 62 are preferably substantially spherical. The first metal 61 and the second metal 62 have shapes similar to a spherical shape so that the contact area between the first metal 61 and the second metal 62 further increases.

It has been known that the first solder 6A shows a tendency not to absorb thermal energy as an average particle diameter of the second metal 62 decreases. This tendency remains even when a ratio of the second metal 62 varies. The contact area between the first metal 61 and the second metal 62 increases upon the melting as the average particle diameter of the second metal 62 decreases. Thus, the reaction between Sn and the Ni—Fe alloy easily progresses and the formation of the Ni—Sn phase 74 accelerates. Meanwhile, manufacturing and handling of the particle of the second metal 62 become difficult as the average particle diameter of the second metal 62 decreases.

Therefore, the average particle diameter of the second metal 62 is preferably 3 to 50 µm, more preferably 5 to 30 µm. When the average particle diameter of the second metal 62 is 50 µm, in the tissue of the first solder 6A after the hardening, the formation of the Ni—Sn phase 74 does not sufficiently progress and a rise of the melting point after the first solder 6A melts and hardens decreases. When the average particle diameter of the second metal 62 is less than 3 µm, it can be thought that the manufacturing and the handling of the particle of the second metal 62 become difficult. When the average particle diameter of the second metal 62 is less than 5 µm, since a surface area with respect to the particle diameter is large, the particle of the second metal 62 tend to oxidize. As a result, there is a risk that the particle of the second metal 62 does not melt by reheating upon the reflow and remains as an oxidized particle on the substrate. Arranging the average particle diameter of the second metal 62 of 5 µm or more can prevent the oxidized particle from remaining and is more preferable. Note that, according to the present embodiment, the average particle diameter of the second metal 62 is in the range of 10 to 36 µm.

According to the present embodiment, an additive ratio of the second metal 62 is preferably 5 to 30 mass % with respect to the sum of the first metal 61 and the second metal 62. In this range, after the electronic component 2 is mounted on the substrate 3 of the electronic component built-in module 1 with the first solder 6A, even when the second reflow is performed in a case where the electronic component built-in module 1 is mounted on the device board 8, the occurrence of the solder flash and the movement of the first solder 6A can be inhibited. Even when the electronic component 2 is mounted on the substrate 3 with the first solder 6A, an appropriate self-alignment effect is obtained so that the electronic component 2 can be positioned. As described above, arranging the additive ratio of the second metal 62 in the above range is suitable for mounting the electronic component 2 included in the electronic component built-in module 1.

Powder of the second metal 62 is manufactured by a method for manufacturing metal powder, such as a water atomization method or a gas atomization method. When the water atomization method is used, a surface of the manufactured powder oxidizes. The first solder 6A is manufactured by adding the second metal 62 with the surface of the powder that has oxidized, to the first metal 61. However, in a melting state, due to an effect of the oxide film, the powder of the second metal 62 gathers on a surface of the first solder 6A that has hardened. As a result, almost all the first metal 61 and the second metal 62 separate from each other so that the reaction between the first metal 61 and the second metal 62 does not accelerate. Thus, the rise of the melting point of the first solder 6A is not expected.

Therefore, when the second metal 62 oxidizes in a process for manufacturing the metal powder, for example, the second metal 62 is preferably deoxidized in a hydrogen atmosphere and then added to the first metal 61. Accordingly, the first metal 61 accelerates the reaction between the first metal 61 and the second metal 62 during the first melting. Therefore, the first solder 6A that has hardened after the melting can secure a melting point higher than that before the melting.

The acceleration of the reaction between the first metal 61 and the second metal 62 is evaluated with an amount of oxygen included in the powder of the second metal 62 as a parameter. As a result, when a ratio of the oxygen included in the powder of the second metal 62 is 1.5 mass %, the acceleration of the reaction between the first metal 61 and the second metal 62 is insufficient and the rise of the melting point of the first solder 6A is not expected. Meanwhile, when the ratio of the oxygen included in the powder of the second metal 62 decreases to 0.24 mass %, the reaction of the first metal 61 and the second metal 62 accelerates and the melting point of the first solder 6A increases.

A ratio of Fe accounting for in the second metal 62 is not particularly limited. However, when the ratio of Fe is 8 mass % or more, the rise of the melting point of the first solder 6A that has hardened after the melting is observed. When the ratio of Fe is 5 mass % or more, the melting point of the first solder 6A that has hardened after the melting becomes higher than the second reflow temperature (240 to 260° C.). Meanwhile, when the ratio of Fe exceeds 16 mass %, the formation of the Ni—Sn phase 74 does not sufficiently progress so that the melting temperature of the first solder 6A may decrease. Therefore, the ratio of Fe accounting for in the second metal 62 is preferably 5 to 16 mass %, more preferably, 8 to 16 mass %.

As described above, the Pb-free solder according to the present embodiment is constituted by adding the second metal 62 including at least Ni—Fe alloy to the first metal 61 including at least Sn and Bi (the above-described first solder 6A). In the process in which the Pb-free solder first melts, the reaction between Sn in the first metal 61 and the Ni—Fe alloy in the second metal 62 promptly progresses. The Ni—Sn phase 74 is formed after the reaction so that the Pb-free solder having hardened has a melting point higher than that before the Pb-free solder first melts and thermal resistance is improved. As a result, even when the Pb-free solder is reheated by the following reflow after melting once, the Pb-free solder does not melt or the melting is inhibited.

The above Pb-free solder is used for bonding the electronic component 2 included in the electronic component built-in module 1. Therefore, a risk that the solder flash or the movement of the solder occurs in the electronic component built-in module 1 in the reflow when the electronic component built-in module 1 is mounted on, for example, the device board 8, can be reduced. The electronic component built-in module 1 using the Pb-free solder can reduce a risk that, for example, a bonding defect of a terminal of the electronic component 2 occurs. Therefore, a yield can be improved.

The Pb-free solder according to the present embodiment has the melting point that increases after the Pb-free solder melts and hardens once. Therefore, the Pb-free solder is effective for, for example, bonding a part that requires thermal resistance. In this case, a temperature at which the Pb-free solder according to the present embodiment first melts is similar to that of a SnBi based (Sn as a base material to which Bi is added) solder (approximately 220° C.). Therefore, workability is prevented from degrading upon the bonding.

The present invention will be further specifically described below based on embodiments and comparative examples. However, the present invention is not limited to the following embodiments.

<Preparations for First Embodiment to Eighth Embodiment, and First Comparative Example to Fourth Comparative Example>

Pb-free solders according to a first embodiment to an eighth embodiment, and a first comparative example to a fourth comparative example were prepared as follows. First, the first metal and the second metal were prepared so as to be combinations illustrated in Table 1. Note that, in Table 1, an amount of each component in the first metal represents a ratio to the entire first metal (mass %). An additive amount of the second metal represents a ratio of the second metal to the sum of the first metal and the second metal (mass %). An amount of Fe represents a ratio to the entire second metal (mass %). Note that, each of the first metal and the second metal used for the Pb-free solder according to each of the first embodiment to the eighth embodiment and the first comparative example to the fourth comparative example, had a granular shape (a substantially spherical shape) and an average particle diameter of 10 μm.

TABLE 1

|  | First metal (Pb-free solder) | | | Second metal (Ni—Fe Alloy) | |
| --- | --- | --- | --- | --- | --- |
|  | Sn (mass %) | Bi (mass %) | Others (mass %) | Additive amount (mass %) | Fe (mass %) |
| First embodiment | 92.5 | 7.5 | — | 10 | 10 |
| Second embodiment | 92.5 | 7.5 | — | 30 | 10 |
| Third embodiment | 92.5 | 7.5 | — | 5 | 10 |
| Fourth embodiment | 87.5 | 12.5 | — | 10 | 10 |
| Fifth embodiment | 85 | 15 | — | 10 | 10 |
| Sixth embodiment | 95 | 5 | — | 10 | 10 |
| Seventh embodiment | 91.5 | 7.5 | Ag 1 | 10 | 10 |
| Eighth embodiment | 92 | 7.5 | Cu 0.5 | 10 | 10 |
| First comparative example | 82.5 | 17.5 | — | 10 | 10 |
| Second comparative example | 97.5 | 2.5 | — | 10 | 10 |
| Third comparative example | 92.5 | 7.5 | — | 2.5 | 10 |
| Fourth comparative example | 92.5 | 7.5 | — | 35 | 10 |

Furthermore, using the first metal 61 including Sn and Bi can use, as heat treatment that accelerates the formation of Ni—Sn phase 74, for example, a heat treatment process in a process for manufacturing the electronic component built-in module 1, such as the mold process. Thus, for example, no additional heat treatment process is required. Accordingly, the workability is dramatically improved. Since the Pb-free solder according to the present embodiment includes relatively inexpensive metals of Sn, Bi, Ni, and Fe, an increase of a manufacturing cost of, for example, the electronic component built-in module 1 can be inhibited.

The Pb-free solder and the electronic component built-in module component according to the embodiment of the present invention have been described. However, the Pb-free solder and the electronic component built-in module component according to the present invention are not limited to the above configuration. In the above embodiment, the electronic component built-in module including the electronic component mounted on the substrate has been described. The Pb-free solder according to the present invention can be also applied to bonding in which high temperature solder is used in the related art, such as bonding through a lead frame.

Twenty samples to be evaluated (electronic component built-in modules) were prepared with each of the Pb-free solders according to the first embodiment to the eighth embodiment and the first comparative example to the fourth comparative example by the following procedure.

(1) A solder paste including the Pb-free solder with the composition illustrated in Table 1 was printed on a terminal electrode of a substrate.

(2) A mounter was used so that a chip-type resistance element, as an electronic component, was mounted on the substrate.

(3) The substrate including the electronic component disposed thereon was put into a reflow furnace and the solder paste was heated at 240 to 260° C. The Pb free-solder included in the solder paste melted and hardened. After that, a terminal electrode of the electronic component and the terminal electrode of the substrate were bonded with the Pb-free solder that had hardened.

(4) Flux adhering to the electronic component and a surface of the substrate were cleaned.

(5) The electronic component and the substrate were covered with an insulating resin. An epoxy resin including a filler added thereto (for example, a silica filler in the present evaluation) was used for the insulating resin for covering the electronic component and the substrate. The electronic component and the substrate were coated with the insulating resin so as to be covered. Then, the insulating resin was subjected to a thermal press so as to harden in a vacuum chamber. As a result, the electronic component was sealed with the insulating resin. Twenty electronic component built-in modules were prepared by the above method.

The electronic component built-in modules obtained by the above method were evaluated regarding thermal resistance (solder flash inhibition), thermal shock resistance (crack inhibition), and mountability (wettability).

<Evaluation Method: 1. Thermal Resistance (Solder Flash Inhibition)>

The thermal resistance (solder flash inhibition) was evaluated as follows. First, the sample to be evaluated (the electronic component built-in module) was put into the reflow furnace at 260° C. A movement of the solder in a bonding portion between the electronic component and the substrate in the electronic component built-in module was observed. When a condition in which a bonding metal (a solder material) of the bonding portion diffused other than the bonding portion, was observed, the evaluation was denoted with D. When no diffusion was observed and a bonding surface of a bonding portion on the side of the substrate varied, the evaluation was denoted with C. When a shape variation of a bonding portion on the side of an electronic component terminal was observed, the evaluation was denoted with B. When the bonding surface and the shape of the bonding portion did not vary, the evaluation was denoted with A.

<Evaluation Method: 2 Thermal Shock Resistance (Crack Inhibition)>

The thermal shock resistance (crack inhibition) was evaluated as follows. First, the sample to be evaluated (the electronic component and the substrate were not covered with the insulating resin) was put into a thermal shock testing machine that alternately provided environments of −55° C. and 125° C. every 30 minutes, and was left in 500 cycles. After that, the bonding portion formed of the solder after the hardening was observed. A crack of a surface of the bonding portion and progress of the solder crack with a cross-sectional observation were checked and evaluated.

When no crack occurred on the bonding portion, the evaluation was denoted with A. When the occurrence of the crack was observed and a length of the crack was ⅓ or less of a thickness of the solder of the bonding portion, the evaluation was denoted with B. When the length of the crack was ⅓ to ½ of the thickness of the solder of the bonding portion, the evaluation was denoted with C. When the length of the crack is ½ or more of the thickness of the solder of the bonding portion, the evaluation was denoted with D.

<Evaluation Method: 3. Mountability (Wettability)>

The mountability (wettability) was evaluated as follows. First, a height of a fillet (a height of wetting) caused by bonding the terminal electrode of the electronic component and the terminal electrode of the substrate with the Pb-free solder, was evaluated. When the wettability of the Pb-free solder that has melted is high, the Pb-free solder easily spreads over the terminal electrode of the electronic component. Accordingly, it can be determined that the higher the height of wetting of the fillet is, the higher the wettability of the Pb-free solder Note that, the height of wetting is defined as a distance from a surface of the terminal electrode of the substrate to a boundary between the terminal electrode of the electronic component and the fillet (an end portion of wetting). When it is difficult to measure the distance between the terminal electrode of the substrate and the end portion of wetting, the height of wetting may be obtained by measuring a distance between a surface of the substrate and the end portion of wetting of the fillet and then subtracting a thickness of the terminal electrode from the distance. When the height of wetting is 70% or more, 50% to less than 70%, 30% to less than 50%, or less than 30%, with respect to the height of the terminal electrode of the electronic component, the wettability is determined as A, B, C, or D, respectively.

<Evaluation Result>

Results of the above three evaluations will be shown in Table 2. When at least one of the thermal resistance (the solder flash inhibition), the thermal shock resistance (the crack inhibition), and the mountability (the wettability) was evaluated with D, an overall evaluation was D. When at least one of the items was evaluated with C, the overall evaluation was C. When at least two of the items were evaluated with A, the overall evaluation was A. Otherwise, the overall evaluation was B.

TABLE 2

|  | Thermal resistance (solder flash inhibition) | Thermal shock resistance (crack inhibition) | Mountability (wettability) | Overall evaluation |
|---|---|---|---|---|
| First embodiment | A | A | B | A |
| Second embodiment | A | B | B | B |
| Third embodiment | B | B | A | B |
| Fourth embodiment | A | A | B | A |
| Fifth embodiment | B | B | B | B |
| Sixth embodiment | B | B | A | B |
| Seventh embodiment | A | A | B | A |
| Eighth embodiment | A | A | B | A |
| First comparative example | D | D | C | D |
| Second comparative example | C | C | A | C |
| Third comparative example | C | C | B | C |
| Fourth comparative example | A | B | D | D |

What is claimed is:

1. A Pb-free solder comprising:
a first metal including at least Sn and Bi; and
a second metal including at least an Ni—Fe alloy,
wherein, in the first metal, a sum of Sn and Bi is 90 mass % or more, and a ratio of Bi is 5 to 15 mass %, and
a ratio of the second metal to a sum of mass of the first metal and mass of the second metal is 5 to 30 mass %.

2. The Pb-free solder according to claim 1, wherein the first metal and the second metal are granular.

3. The Pb-free solder according to claim 2, wherein an average particle diameter of the second metal is 3 to 50 μm.

4. An electronic component built-in module comprising:
an electronic component; and
a substrate including the electronic component mounted thereon,
wherein a terminal of the electronic component and a terminal of the substrate are bonded with the Pb-free solder according to claim 1.

* * * * *